US011637567B2

(12) United States Patent
Nakada et al.

(10) Patent No.: US 11,637,567 B2
(45) Date of Patent: Apr. 25, 2023

(54) DECODING CIRCUIT

(71) Applicant: SONY SEMICONDUCTOR SOLUTIONS CORPORATION, Kanagawa (JP)

(72) Inventors: Yutaka Nakada, Kanagawa (JP); Satoshi Okada, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 83 days.

(21) Appl. No.: 17/250,427

(22) PCT Filed: Jul. 23, 2019

(86) PCT No.: PCT/JP2019/028914
§ 371 (c)(1),
(2) Date: Jan. 20, 2021

(87) PCT Pub. No.: WO2020/026899
PCT Pub. Date: Feb. 6, 2020

(65) Prior Publication Data
US 2021/0344353 A1 Nov. 4, 2021

(30) Foreign Application Priority Data

Jul. 30, 2018 (JP) .............................. JP2018-142608

(51) Int. Cl.
*H03M 13/11* (2006.01)
*H03M 13/15* (2006.01)
(Continued)

(52) U.S. Cl.
CPC ..... *H03M 13/1105* (2013.01); *H03M 13/152* (2013.01); *H03M 13/2792* (2013.01); *H03M 13/2927* (2013.01); *H04L 1/0071* (2013.01)

(58) Field of Classification Search
None
See application file for complete search history.

(56) References Cited

U.S. PATENT DOCUMENTS

2006/0232447 A1* 10/2006 Walker ............. H04W 52/0245
341/50
2010/0199301 A1 8/2010 Hayashi et al.
(Continued)

FOREIGN PATENT DOCUMENTS

CA 3072720 A1 * 1/2016 ............. B41J 2/005
CN 101779454 A 7/2010
(Continued)

OTHER PUBLICATIONS

International Search Report and Written Opinion of PCT Application No. PCT/JP2019/028914, dated Aug. 27, 2019, 09 pages of ISRWO.

*Primary Examiner* — Cynthia Britt
*Assistant Examiner* — Matthew W Wahlin
(74) *Attorney, Agent, or Firm* — Chip Law Group

(57) ABSTRACT

There is provided a decoding circuit including: a first decoding unit that decodes a first signal from a multiplexed signal in which the first signal and a second signal are multiplexed in an LDM (Layered Division Multiplexing) system; and a second decoding unit that decodes the second signal from the multiplexed signal using the decoding result of the decoded first signal, wherein the second signal is selectively decoded based on noise information related to a reception state of the multiplexed signal.

12 Claims, 9 Drawing Sheets

(51) Int. Cl.
*H03M 13/27* (2006.01)
*H03M 13/29* (2006.01)
*H04L 1/00* (2006.01)

(56) References Cited

U.S. PATENT DOCUMENTS

2017/0201336 A1    7/2017   Park et al.
2018/0358023 A1   12/2018   Sasaki

FOREIGN PATENT DOCUMENTS

| | | |
|---|---|---|
| CN | 106489257 A | 3/2017 |
| EP | 2175651 A1 | 4/2010 |
| EP | 3169030 A1 | 5/2017 |
| EP | 3334075 A1 * | 6/2018 |
| JP | 2009-033340 A | 2/2009 |
| JP | 5137955 B1 | 2/2013 |
| JP | 2017-527167 A | 9/2017 |
| JP | 2017-529028 A | 9/2017 |
| JP | 2018-504005 A | 2/2018 |
| KR | 10-2016-0006603 A | 1/2016 |
| WO | 2009/016835 A1 | 2/2009 |
| WO | 2016/006878 A1 | 1/2016 |
| WO | 2017/081874 A1 | 5/2017 |

\* cited by examiner

DECODING CIRCUIT

CROSS REFERENCE TO RELATED APPLICATIONS

This application is a U.S. National Phase of International Patent Application No. PCT/JP2019/028914 filed on Jul. 23, 2019, which claims priority benefit of Japanese Patent Application No. JP 2018-142608 filed in the Japan Patent Office on Jul. 30, 2018. Each of the above-referenced applications is hereby incorporated herein by reference in its entirety.

TECHNICAL FIELD

The present disclosure relates to a decoding circuit.

BACKGROUND ART

As a method to multiplex broadcasting signals, a technique to multiplex signals in a power direction, called the LDM (Layered Division Multiplexing) system, has been developed. For example, the technique is disclosed in PTL 1 and 2.

CITATION LIST

Patent Literature

[PTL1]
Japanese Translation of PCT Application No. 2017-527167
[PTL2]
Japanese Translation of PCT Application No. 2018-504005

SUMMARY

Technical Problem

In a case of multiplexing two types of signals in the LDM system, these two types of signals are called a core layer signal and an enhanced layer signal, for example. In a case of decoding a multiplex signal multiplexed in the LDM system, the core layer signal is decoded first, then the enhanced layer signal is decoded using the decoding result the core layer signal.

In order to be successful in decoding the enhanced layer signal, the decoding of the core layer signal must be successful first. However, in some cases, even if processing fails in the middle of decoding the core layer signal, decoding of the enhanced layer signal may be successful.

This disclosure proposes a decoding circuit that can decode the multiplexed signal more efficiently in the LDM system.

Solution to Problem

A decoding circuit that is provided according to the present disclosure includes: a first decoding unit that decodes a first signal from a multiplexed signal in which the first signal and a second signal are multiplexed in an LDM system; and a second decoding unit that decodes the second signal from the multiplexed signal, and the second signal is selectively decoded based on noise information related to a reception state of the multiplexed signal.

Another decoding circuit that is provided according to the present disclosure includes: a first decoding unit that decodes a first signal from a multiplexed signal in which the first signal and a second signal are multiplexed in an LDM system; and a second decoding unit that decodes the second signal from the multiplexed signal, and the second signal is selectively decoded based on the decoding result of the first signal.

Advantageous Effects of Invention

According to present disclosure, multiplexed signal can be more efficiently decoded in the LDM system.

It should be noted that the above effect is not limited, and any effect indicated in the present description or a different effect that may be grasped based on the present description may be implemented along with or instead of the above-mentioned effect.

DESCRIPTION OF EMBODIMENTS

Embodiments of the present disclosure will now be described with reference to the accompanying drawings. In the present description and drawings, composing elements having substantially a same functional configuration are denoted with a same reference sign, and redundant explanation thereof is omitted.

Description will be performed according to the following sequence.

1. Overview
2. Embodiment 1
2-1. Configuration of signal processing system 1000 according to Embodiment 1
2-2. Configuration example of demodulating circuit 200 according to Embodiment 1
2-3. Configuration example of decoding unit 240 according to Embodiment 1
2-4. Example of operation flow of decoding unit 240 according to Embodiment 1

3. Embodiment 2
3-1. Configuration example of decoding unit 240 according to Embodiment 2
3-2. Example of operation flow of decoding unit 240 according to Embodiment 2
4. Embodiment 3
5. Conclusion

1. OVERVIEW

An overview of an embodiment of the present disclosure will be described first. In recent years, ATSC (Advanced Television Systems Committee) 3.0 was developed as a standard of digital television broadcasting. In the ATSC 3.0 standard, the LDM system is used as a method of multiplexing signals. The LDM system here refers to a multiplexing system in which a plurality of signals, each of which has a different power, are collectively transmitted as one signal.

In the ATSC 3.0 standard, a first signal and a second signal are multiplexed in the LDM system. The first signal and the second signal are also called a core layer signal and an enhanced layer signal respectively. The core layer signal is used for such an application as mobile communication, for example. The enhanced layer signal is used for such an application as stationaries and televisions. In the case of decoding a broadcasting signal in which the two types of signals are multiplexed in the LDM system (hereafter called "multiplexed signal"), a receiver must decode the core layer signal first, then decode the enhanced layer signal.

Figure 1:
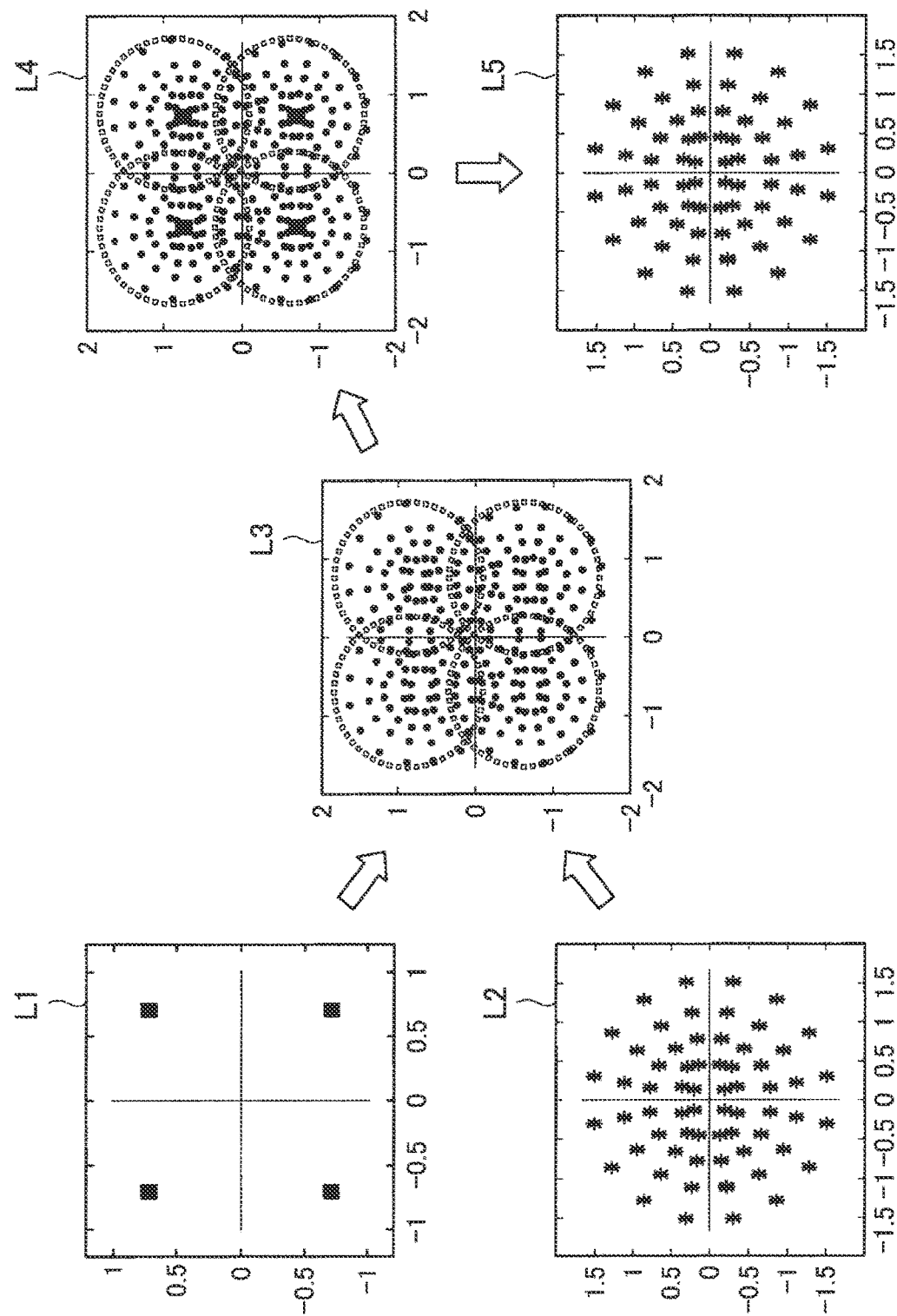
FIG. 1 is a diagram for explaining an overview of multiplexing in the LDM system.

FIG. 1 is a diagram for explaining an overview of multiplexing in the LDM system. In FIG. 1, various constellations related to the LDM system are illustrated. Here signal points of a core layer signal are indicated as a constellation L1. Further, signal points of an enhanced layer signal are indicated as a constellation L2. In the case of transmission, the core layer signal and the enhanced signal are multiplexed, and a multiplexed signal is generated. Signal points of the generated multiplexed signal are indicated as a constellation L3. Here a constellation refers to a diagram generated by plotting the signal points of data, when a signal is digitally modulated, on an IQ plane. Further, the IQ plane refers to a two-dimensional complex plane of which abscissa is an in-phase axis (I axis), and ordinate is a quadrature axis (Q axis).

The receiver receives the multiplexed signal. Then the receiver decodes the core layer signal first. The receiver extracts data of the core layer signal by this decoding. In FIG. 1, the signal points of the signal in this decoding result are indicated as a constellation L4. When the core layer signal is decoded, the enhanced layer signal is treated as noise.

Then the receiver acquires the enhanced layer signal by subtracting the result of decoding the core layer signal from the signal acquired after decoding the core layer signal. In FIG. 1, the signal points of the acquired enhanced layer signal are indicated as a constellation L5. The receiver extracts the data of the enhanced layer signal by decoding the acquired enhanced layer signal.

As described above, in the case of the multiplexed signal, which is multiplexed in the LDM system, the decoding result of the core layer signal is used for decoding the enhanced layer signal. Therefore, in order to succeed in decoding the enhanced layer signal, decoding of the core layer signal must be successful. This means that executing decoding of the enhanced layer signal when decoding of the core layer signal failed consumes power needlessly. A possible countermeasure is that in the case where decoding of the core layer signal failed, decoding processing of the enhanced layer signal is not executed in order to reduce power consumption.

To decode the core layer signal and the enhanced layer signal, the LDPC (Low Density Parity Check) decoding is performed, then the BCH decoding is performed, in the case of the ATSC 3.0 standard, for example.

As described above, in order to succeed in decoding the enhanced layer signal, decoding of the core layer signal must be successful. However, in some cases where the enhanced layer signal is decoded using the result of the LDPC decoding of the core layer signal, decoding of the enhanced layer signal may be successful even if this LDPC decoding failed, under such a predetermined condition as burst noise. In such a case, processing efficiency drops if decoding of the enhanced layer signal is stopped, in order to reduce power consumption for example, when the LDPC decoding of the core layer signal failed.

The technical idea according to an embodiment of the present disclosure was conceived with the foregoing in view, so that a first signal is decoded from a multiplexed signal in which the first signal and a second signal are multiplexed in the LDM system, and the second signal is selectively decoded from the multiplexed signal based on the noise information. Because of this function, the multiplexed signal can be decoded more efficiently in the LDM system.

2. EMBODIMENT 1

2-1. Configuration of Signal Processing System 1000 According to Embodiment 1

Figure 2:
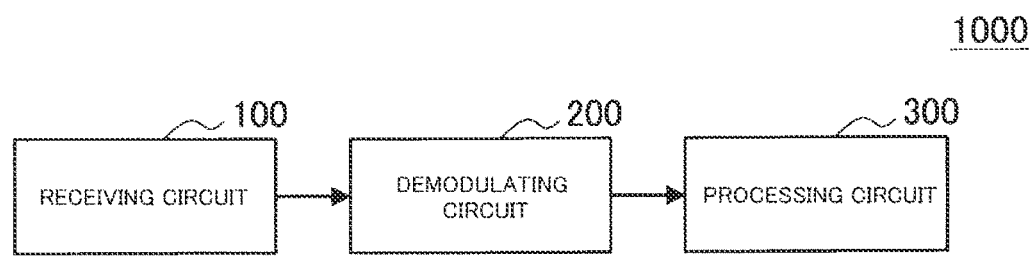
FIG. 2 is a diagram for explaining an example of a signal processing system 1000 according to a decoding processing.

FIG. 2 is a diagram for explaining an example of a signal processing system 1000 according to a decoding processing. As indicated in FIG. 2, the signal processing system 1000 includes a receiving circuit 100, a demodulating circuit 200 and a processing circuit 300. "The receiving circuit 100 and the demodulating circuit 200" and "the demodulating circuit 200 and the processing circuit 300" are electrically connected via one or plurality of wires respectively, and various signals (analog signals or digital signals) are transmitted between circuits.

(Receiving Circuit 100)

The receiving circuit 100 is a circuit (or circuit group) that has a function to receive broadcasting signals.

For example, the receiving circuit 100 includes an antenna (not illustrated), a first filter (not illustrated), an amplifier (not illustrated), a mixer (not illustrated) and a second filter (not illustrated).

The antenna (not illustrated) is constituted of an antenna having an arbitrary configuration, such as a dipole antenna, a monopole antenna, a chip antenna or a pattern antenna, for example, and receives radio waves that carry the broadcasting signal. The first filter (not illustrated) is constituted of an arbitrary filter, such as a low-pass filter and a band-pass filter, for example, and removes unnecessary frequency components from a signal received by the antenna (not illustrated). The amplifier (not illustrated) is constituted of an arbitrary amplifier, such as an LNA (Low-Noise Amplifier), and amplifies a signal transmitted from the first filter (not illustrated). A signal transmitted from the amplifier (not illustrated) and a signal having a predetermined frequency generated by an oscillator (not illustrated) or the like are inputted to the mixer (not illustrated), and the mixer (not illustrated) converts the signal transmitted from the amplifier (not illustrated) into an IF (intermediate Frequency) signal.

The second filter (not illustrated) is constituted of an arbitrary filter, such as a low-pass filter and a band-pass filter, and removes unnecessary frequency components from the IF signal. The signal outputted from the second filter (not illustrated) corresponds to the broadcasting signal (modulation signal modulated by a predetermined system) received in the receiving circuit 100.

The configuration of the receiving circuit 100 is not limited to the above-mentioned example. The receiving circuit 100 may have an arbitrary configuration that can receive broadcasting signals transmitted via radio waves, for example.

(Demodulating Circuit 200)

The demodulating circuit 200 is a circuit (or circuit group) that has a function to demodulate a multiplexed signal received by the receiving circuit 100. The demodulating circuit 200 demodulates a multiplexed signal that has been multiplexed in the LDM system. The modulating circuit 200 can also determine noise information related to a reception state of the multiplexed signal. The noise information is used for decoding processing of the multiplexed signal. The noise information will be described later.

The demodulating circuit 200 includes a demodulating unit 220 and a decoding unit 240 which will be described later.

An example of the demodulating circuit 200 is "an IC (integrated Circuit) chip which includes one processor or two or more processors, and in which various circuits to implement the functions of the demodulating circuit 200 are integrated". Needless to say, the demodulating circuit 200 need not be implemented in the form of an IC chip.

The demodulating circuit 200 may include a part of or all of the configuration of the receiving circuit 100. In other words, the demodulating circuit 200 indicated in FIG. 2 may further include a part of or all of the functions of the receiving circuit 100 indicated in FIG. 2. In the case where the demodulating circuit 200 further includes a part of or all of the functions of the receiving circuit 100, the part of or all of the configuration of the receiving circuit 100 included in the demodulating circuit 200 play a role of the receiving unit in the demodulating circuit 200.

(Processing Circuit 300)

The processing circuit 300 is a circuit (or circuit group) that processes a broadcasting signal demodulated by the demodulating circuit 200, that is, the core layer data and the enhanced layer data (hereafter may be referred to as "E layer data") extracted by the demodulating circuit 200.

The signal processing system 1000 demodulates a received broadcasting signal, and processes the demodulated broadcasting signal using the configuration indicated in FIG. 2, for example.

The configuration of the signal processing system according to the present embodiment is not limited to the example indicated in FIG. 2.

For example, in the case of being connected electrically to an external receiving circuit which has similar functions and configuration to the receiving circuit 100, the signal processing system 1000 according to the present embodiment may not include the receiving circuit 100 indicated in FIG. 2.

Further, the demodulating circuit 200 indicated in FIG. 2 may include a part of or all of the configuration of the receiving circuit 100. An example of the configuration of the demodulating circuit 200 which includes a part of the configuration of the receiving circuit 100 is "a configuration in which the demodulating circuit 200 is connected to an external antenna (an example of a part of the configuration of the receiving circuit 100)". The demodulating circuit 200 connected to the external antenna processes broadcasting signals received by this antenna.

Furthermore, the signal processing system according to the present embodiment may include a part of or all of a processor (not illustrated), a ROM (Read Only Memory, not illustrated), a RAM (Random Access Memory, not illustrated), a recording medium (not illustrated), a display device (not illustrated), a voice output device (not illustrate), an operation device (not illustrated) and a communication device (not illustrated). The signal processing system according to the present embodiment may have a configuration in accordance with an application example of the signal processing system of the present embodiment, which will be described later.

The processor (not illustrated) is constituted of such an arithmetic circuit as an MPU (microprocessing unit), and has a function to control the signal processing according to the present embodiment in general, for example. In the signal processing system 1000 indicated in FIG. 2, the processing circuit 300 may play a role of the processor (not illustrated).

The ROM (not illustrated) stores data for control, such as programs used by the processor (not illustrated) and operation parameters. The RAM (not illustrated) temporarily stores programs executed by the processor (not illustrated), for example.

The recording medium (not illustrated) is a storage unit included in the signal processing system according to the present embodiment, and stores various data, such as data related to the processing method used in the demodulating circuit 200, for example. An example of the recording medium (not illustrated) is a non-volatile memory, such as a flash memory. It should be noted that the signal processing system according to the present embodiment may not include the recording medium (not illustrated), but various data, such as data related to the processing method according to the present embodiment, may be stored in an external recording medium of the signal processing system according to the present embodiment.

The display device (not illustrated) displays various images, such as an image related to a UI (User Interface), on the display screen, for example. Examples of the display device (not illustrated) are a liquid crystal display and an organic EL display. The display device may be a device which can perform display and operation, such as a touch panel, for example The voice output device (not illustrated) outputs various voices, such as voices (including music), in accordance with the broadcasting signals, for example. An example of the voice output device (not illustrated) is a speaker.

The operation device (not illustrated) is a device which a user of the signal processing system according to the present embodiment can operate. Examples of the operation device (not illustrated) are buttons, directional keys, rotating type selector (jog dial, for example) or a combination of these devices.

The communication device (not illustrated) is a communication unit included in the signal processing system according to the present embodiment, and plays a role of communicating with an external device wirelessly or via cable. Examples of the communication device (not illustrated) are: a communication antenna and an RF (Radio Frequency) circuit (radio communication); an IEEE 802.15.1 port and a transmitting/receiving circuit (radio communication); an IEEE 802.11 port and a transmitting/ receiving circuit (radio communication); and a LAN (Local Area Network) terminal and a transmitting/receiving circuit (cable communication).

In the following, a case where the multiplexed signal is a signal in which a first signal and a second signal are multiplexed will be described as an example. Here the first signal is the core layer signal, and the second signal is the enhanced layer signal. The first signal and the second signal are multiplexed based on the ATSC 3.0 standard, for example. Needless to say, the signals that the signal processing system according to the present embodiment can process are not limited to the signals conforming to the ATSC 3.0 standard.

2-2. Configuration Example of Demodulating Circuit 200 According to Embodiment 1

Figure 3:
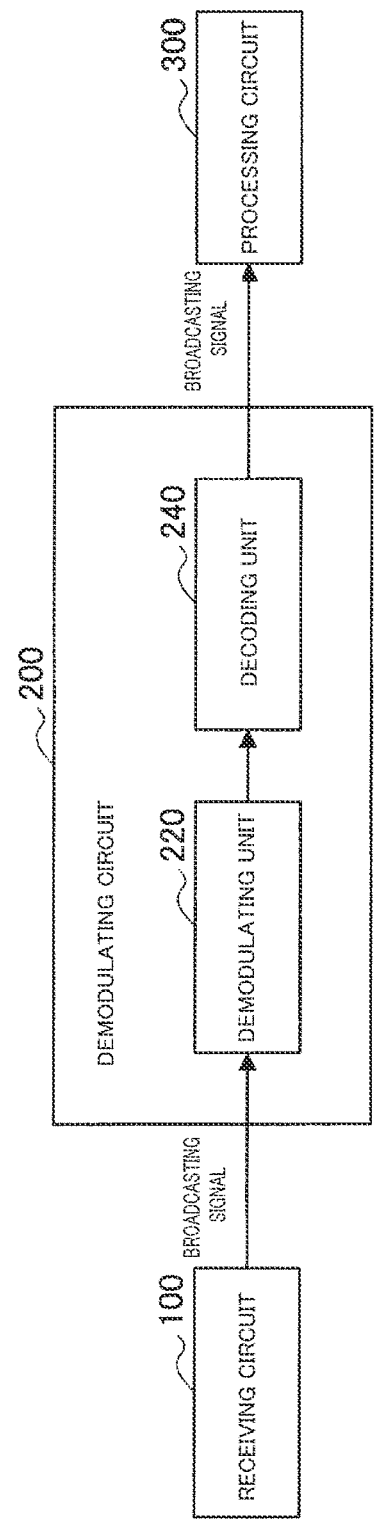
FIG. 3 is a block diagram depicting a configuration example of a demodulating circuit 200 according to Embodiment 1.

A configuration example of the demodulating circuit 200 according to an embodiment of the present disclosure will be described next. FIG. 3 is a block diagram depicting a configuration example of the demodulating circuit 200 according to the present embodiment. The demodulating circuit 200 includes the demodulating unit 220 and the decoding unit 240.

(Modulating Unit 220)

The demodulating unit 220 according to the present embodiment is a circuit that includes a function to demodulate a multiplexed signal received from the receiving circuit 100. Specifically, the demodulating unit 220 executes processing on a QPSK-modulated signal, for example. The function of the demodulating unit 220 is implemented by a processor, for example.

The demodulating circuit 200 also has a function to estimate SN (Signal Noise) or to estimate CN (Carrier Noise). Here the SN estimation and the CN estimation refer to calculating the ratio of the noise with respect to the signal or carrier by comparing a signal determined by a standard and a signal that is actually received. This calculation of the ratio of the noise will be described later.

(Decoding Unit 240)

The decoding unit 240 according to the present embodiment is a decoding circuit that has a function to decode a multiplexed signal demodulated by the demodulating unit 220 and extract the core layer data and enhanced layer data. Here the core layer data and enhanced layer data refer to the data extracted by decoding the core layer signal and the enhanced layer signal respectively. The function of the decoding unit 240 is implemented by a processor, for example.

2-3. Configuration Example of Decoding Unit 240 According to Embodiment 1

Figure 4:
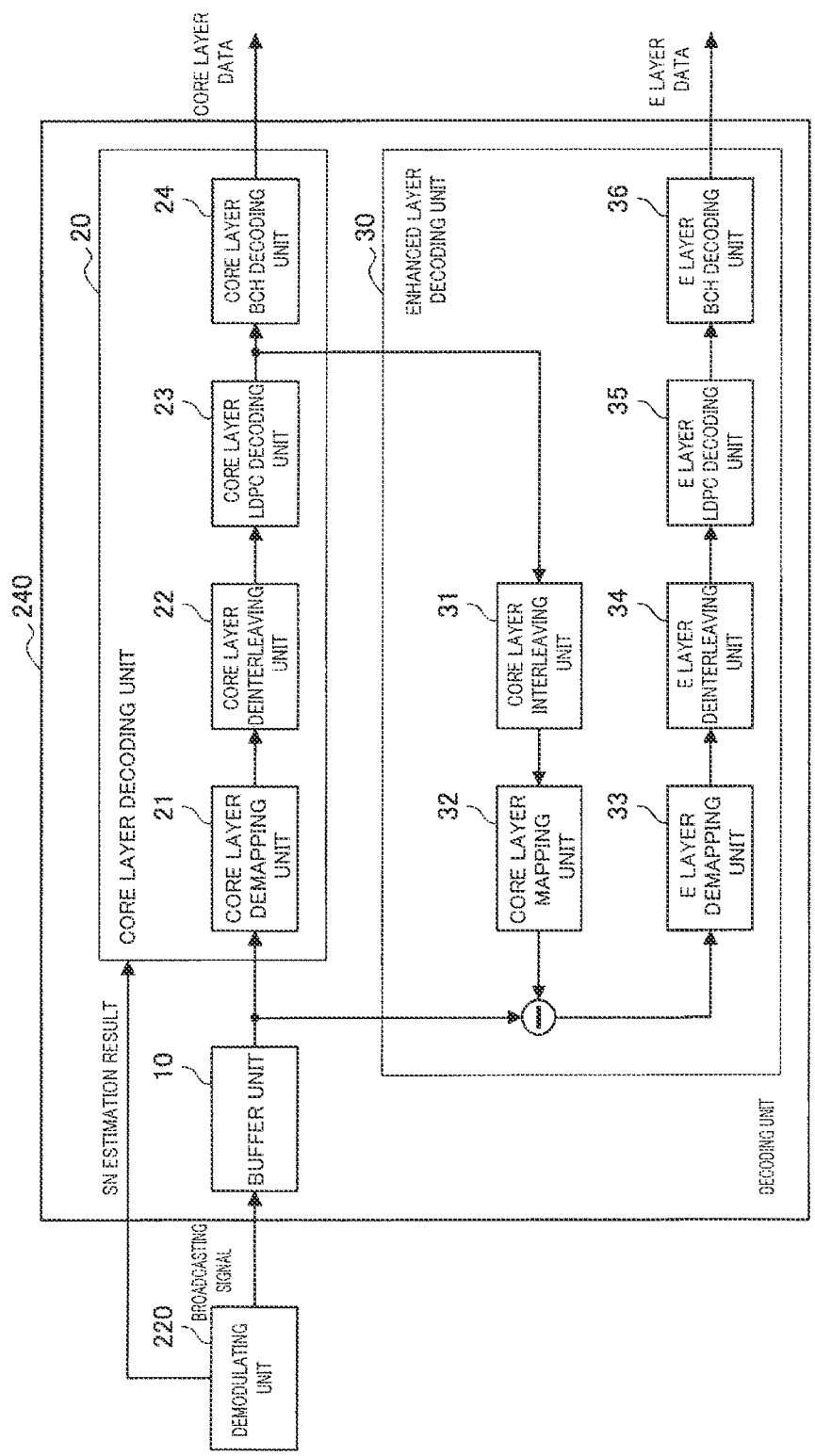
FIG. 4 is a block diagram depicting a configuration example of a decoding unit 240 according to Embodiment 1.

A configuration example of the decoding unit 240 according to an embodiment of the present disclosure will be described next. FIG. 4 is a block diagram depicting a configuration example of a decoding unit 240 according to the present embodiment. The decoding unit 240 includes a buffer unit 10, a core layer decoding unit 20, and an enhanced layer decoding unit 30.

In the present description, a case where a transmitter, which transmits a multiplexed signal, executes BCH encoding processing and LDPC encoding processing respectively for the two types of signals, performs interleave, and multiplexes these signals in the LDM system, and a receiver receives this multiplexed signal, will be described.

(Buffer Unit 10)

The buffer unit 10 according to this embodiment has a function to store a multiplexed signal transmitted from the receiving circuit 100. The buffer unit 10 also transmits the multiplexed signal to a later mentioned core layer demapping unit 21 or a later mentioned enhanced layer decoding unit 30.

(Core Layer Decoding Unit 20)

The core layer decoding unit 20 according to the present embodiment is a first decoding unit that has a function to decode a core layer signal from a multiplexed signal. In this case, the core layer decoding unit 20 treats the enhanced layer signal as noise. The core layer decoding unit 20 includes the core layer demapping unit 21, a core layer deinterleaving unit 22, a core layer LDPC decoding unit 23 and a core layer BCH decoding unit 24.

The core layer decoding unit 20 according to the present embodiment receives, from the demodulating unit 220, noise information to determine whether decoding processing of the enhanced layer signal is performed. Here the noise information refers to an SN estimation result which is a result of the SN estimation, or a CN estimation result which is a result of the CN estimation. The operation of the core layer decoding unit 20 using the noise information will be described later.

(Core Layer Demapping Unit 21)

The core layer demapping unit 21 according to the present embodiment executes processing to demap the core layer signal, out of the multiplexed signal received from the buffer unit 10 and convert the demapped core layer signal into a data string of the core layer signal.

(Core Layer Deinterleaving Unit 22)

The core layer deinterleaving unit 22 according to the present embodiment executes processing to return the data string of the core layer signal, demapped by the core layer demapping unit 21, back to the state before interleave was performed.

(Core Layer LDPC Decoding Unit 23)

The core layer LDPC decoding unit 23 according to the present embodiment executes processing to LDPC-decode a data string of an LDPC-encoded care layer signal transmitted from the core layer deinterleaving unit 22. The result of the LDPC decoding that is transmitted may include data for parity check.

Further, in the case where the core layer decoding unit 20 determines that decoding processing of the enhanced layer signal is performed, based on the noise information related to the reception state of the multiplexed signal received from the demodulating unit 220, the core layer LDPC decoding unit 23 according to the present embodiment transmits the result of the LDPC decoding to a later mentioned core layer interleaving unit 31.

In the case where the core layer decoding unit 23 determines that the reception state of the multiplexed signal is not good, the result of the LDPC decoding is not transmitted to the later mentioned core layer interleaving unit 31. Here "the reception state is not good" refers to the multiplexed signal that includes considerable noise, for example. More specifically, "the reception state is not good" refers to the amount of noise that exists in the multiplexed signal is equivalent to or exceeds a predetermined threshold, for example.

(Core Layer BCH Decoding Unit 24)

The core layer BCH decoding unit 24 according to the present embodiment executes processing to BCH-decode a BCH-encoded data string transmitted from the core layer deinterleaving unit 22. The core layer BCH decoding unit 24 also transmits core layer data, which is a BCH-decoded data string, to the processing circuit 300.

In the case of the ATSC 3.0 standard, the core layer BCH decoding unit 24 may execute processing to perform CRC (Cyclic Redundancy Check) instead of BCH decoding.

Further, in the case where the core layer decoding unit 20 determines that decoding processing of the enhanced layer signal is performed based on the noise information related to the reception state of the multiplexed signal received from the demodulating unit 220, the core layer BCH decoding unit 24, according to the present embodiment, may transmit the result of BCH decoding to the later mentioned core layer interleaving unit 31 instead of the core layer LDPC decoding unit 23.

(Enhanced Layer Decoding Unit 30)

The enhanced layer decoding unit 30 according to the present embodiment is a second decoding unit that has a multiplexed signal received from the buffer unit 10, and that a function received from the core layer LDPC decoding unit 23. The enhanced layer decoding unit 30 includes the core layer interleaving unit 31, a core layer mapping unit 32, an E layer demapping unit 33, an E layer deinterleaving unit 34, an E layer LDPC decoding unit 35 and the E layer BCH decoding unit 36.

Further, the enhanced layer decoding unit 30 according to the present embodiment executes processing to acquire the constellation of the enhanced layer signal by subtracting the constellation transmitted by the later mentioned core layer mapping unit 32 from the constellation transmitted by the buffer unit 10.

(Core Layer Interleaving Unit 31)

The core layer interleaving unit 31 according to the present embodiment receives the processing result of the LDPC decoding transmitted from the core layer LDPC decoding unit 23. The core layer interleaving unit 31 also executes the processing to perform interleaving on this result.

(Core Layer Mapping Unit 32)

The core layer mapping unit 32, according to the present embodiment, executes processing to map a data string interleaved by the core layer interleaving unit 31 on the IQ plane, and acquire the constellation of the core layer signal.

(E Layer Demapping Unit 33)

The E layer demapping unit 33 according to the present embodiment executes processing to demap the enhanced layer signal reproduced by the enhanced layer decoding unit 30 and convert the result into a data string.

(E Layer Deinterleaving Unit 34)

The E layer deinterleaving unit 34 according to the present embodiment executes processing to return the data string of the core layer signal, demapped by the E layer demapping unit 33, back to the state before interleaving.

(E Layer LDPC Decoding Unit 35)

The E layer LDPC decoding unit 35 according to the present embodiment executes processing to LDPC-decode the LDPC-encoded data string transmitted from the E layer deinterleaving unit 34.

(E Layer BCH Decoding Unit 36)

The E layer BCH decoding unit 36 according to the present embodiment executes processing to BCH-decode the BCH-encoded data string transmitted from the E layer deinterleaving unit 34. The E layer BCH decoding unit 36 also transmits enhanced layer data (E layer data), which is a BCH-decoded data string, to the processing circuit 300.

Figure 5:
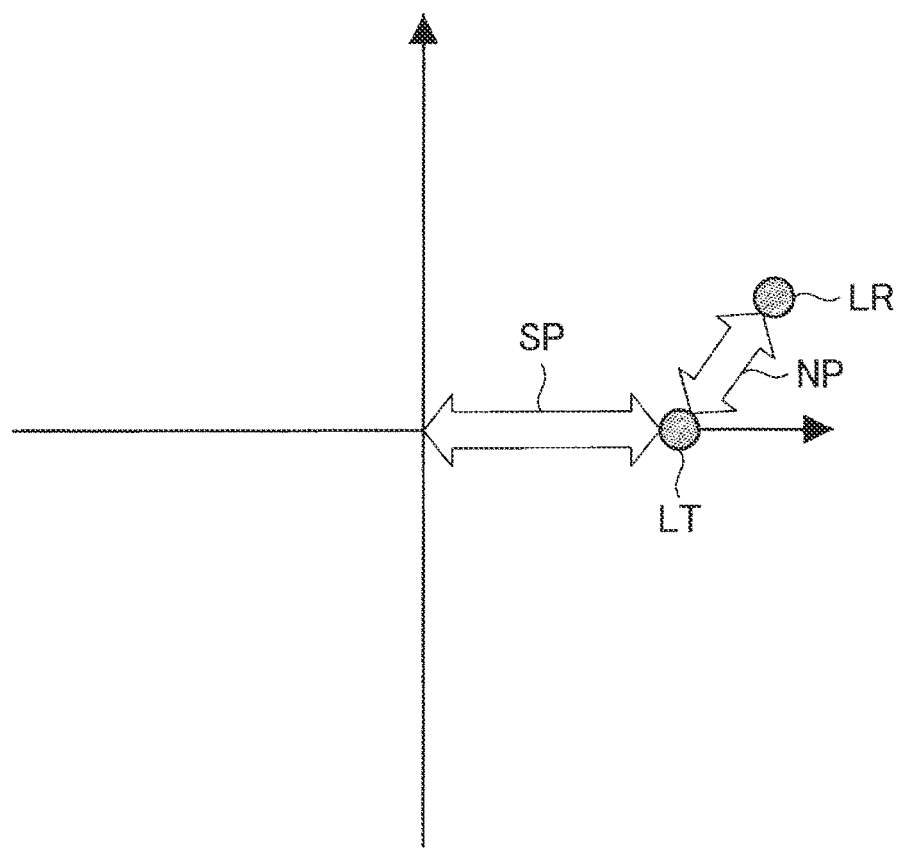
FIG. 5 is a diagram for explaining SN (Signal Noise) estimation according to Embodiment 1.

Operation of the core layer decoding unit 20 using noise information will now be described. FIG. 5 is a diagram for explaining SN estimation according to the present embodiment. In FIG. 5, a transmitting point LT and a receiving point LR are indicated on the IQ plane. As mentioned above, the SN estimation and the CN estimation refer to comparing a signal determined by a standard and a signal actually received and calculating the ratio of the noise with respect to the signal or carrier.

The SN estimation according to the present embodiment will now be described. In order to perform the SN estimation, power of the signal during transmission and power of the noise must be calculated as specified in the standard. To calculate the power of the signal, a pilot is used. The pilot signal here refers to a signal of a pattern which is determined between the transmitting side and the receiving side in advance. In the case of the ATSC 3.0 standard, three types of pilot signals exist. These three types of pilot signals have known values.

In FIG. 5, the distance between the transmitting point LT of the signal during transmission specified by the standard and the origin indicates the power SP of the signal during transmission. The distance between the receiving point LR of the signal that is actually received and the transmitting point LT of the signal during transmission specified by the standard indicates the power NP of the noise. Therefore, the SN ratio is determined by dividing the power SP during transmission by the power NP of the noise.

By using the above-mentioned method, the demodulating unit 220 calculates the SN ratio based on the received pilot signal. Furthermore, the demodulating unit 220 averages a predetermined number of data of the calculated SN ratio, calculates the SN estimation result, and transmits the SN estimation result to the buffer unit 10. An example of the method of averaging the data of the SN ratio is a method of determining an average value of a number of symbols or an average value in unit time of the signals.

Then the core layer decoding unit 20 determines whether the decoding processing of the enhanced layer signal is performed or not based on the SN estimation result transmitted from the demodulating unit 220. Specifically, the core layer decoding unit 20 determines whether the decoding processing of the enhanced layer signal is performed or not in accordance with the magnitude relationship between the SN estimation result, which is an averaged SN ratio, and the required SN.

Here the required SN is a threshold to determine whether the decoding processing of the enhanced layer signal is performed or not. The required SN may be calculated based on the additive white Gaussian noise channel theory. Based on this theory, the required SN ratio can be calculated using a relational expression of the channel capacity, the bandwidth, and the SN ratio in accordance with this theory.

2-4. Example of Operation Flow of Decoding Unit 240 According to Embodiment 1

Figure 6:
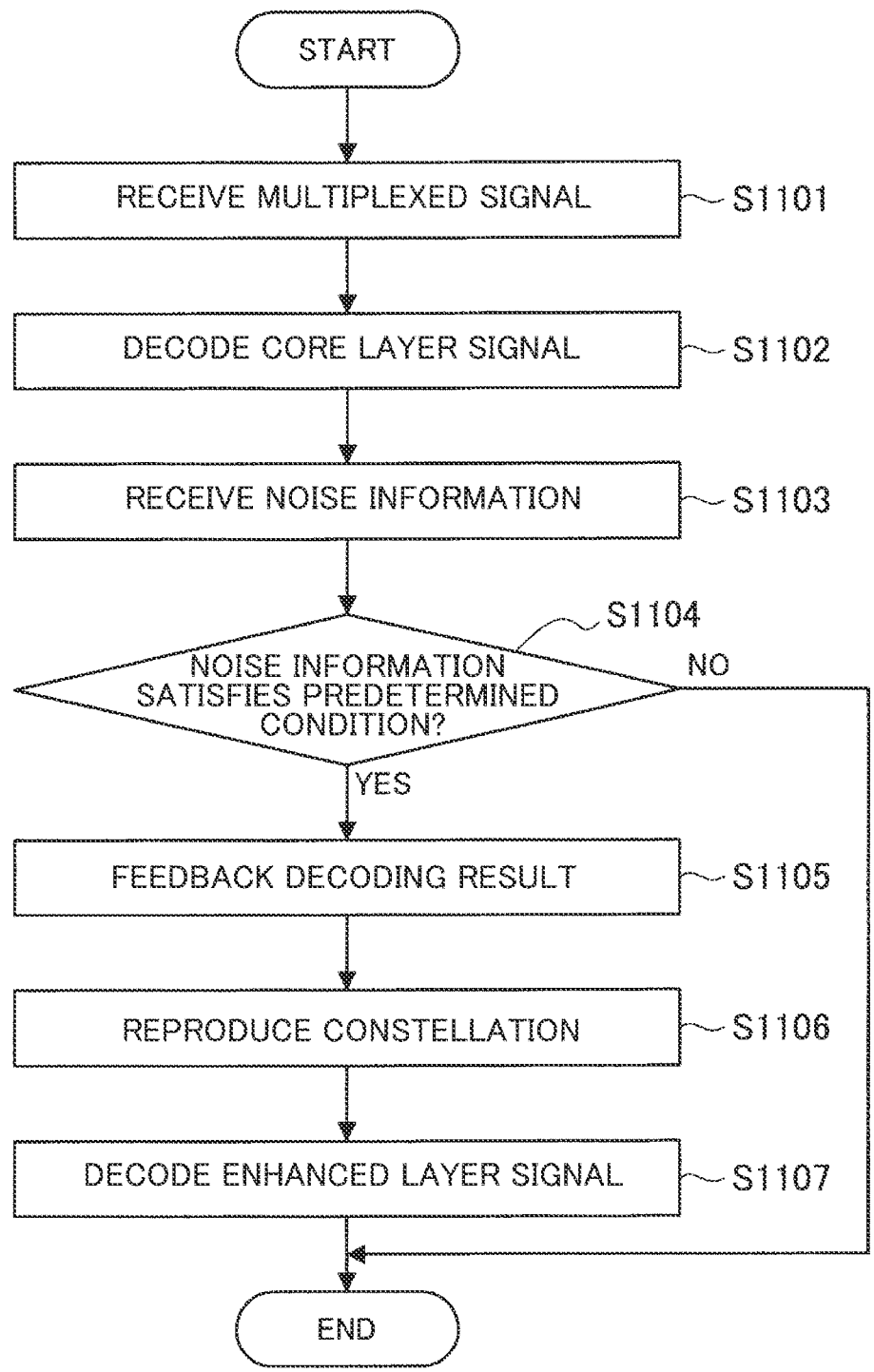
FIG. 6 is a flow chart depicting an example of an operation flow of the decoding unit 240 to decode a multiplexed signal according to Embodiment 1.

An operation flow of the decoding unit 240 to decode a multiplexed signal according to the present embodiment will be described next. FIG. 6 is a flow chart depicting an example of the operation flow of the decoding unit 240 to decode a multiplexed signal according to the present embodiment.

With reference to FIG. 6, the buffer unit 10 receives a multiplexed signal transmitted from the demodulating unit 220 first (S1101). Then the core layer decoding unit 20 decodes the multiplexed signal transmitted from the buffer unit 10 using the core layer demapping unit 21, the core layer deinterleaving unit 22, the core layer LDPC decoding unit 23 and the core layer BCH decoding unit 24 (S1102). Then the core layer decoding unit 20 receives noise information from the demodulating unit 220 (S1103). Then based on the received noise information, the core layer decoding unit 20 determines whether the enhanced layer signal is decoded or not (S1104). In the case where the core layer decoding unit 20 determines that the received enhanced layer signal is decoded (S1104: YES), the core layer LDPC decoding unit 23 transmits the result of the LDPC decoding to the core layer interleaving unit 31 (S1105).

Then the enhanced layer decoding unit 30 reproduces the constellation of the enhanced layer signal using the core layer interleaving unit 31 and the core layer mapping unit 32 based on the result of the LDPC decoding transmitted from the core layer LDPC decoding unit 23 (S1106). Then the enhanced layer decoding unit 30 decodes the enhanced layer signal using the E layer demapping unit 33, the E layer deinterleaving unit 34, the E layer LDPC decoding unit 35, and the E layer BCH decoding unit 36 (S1107).

An example of the operation flow of the decoding unit 240 was described above.

Figure 7:
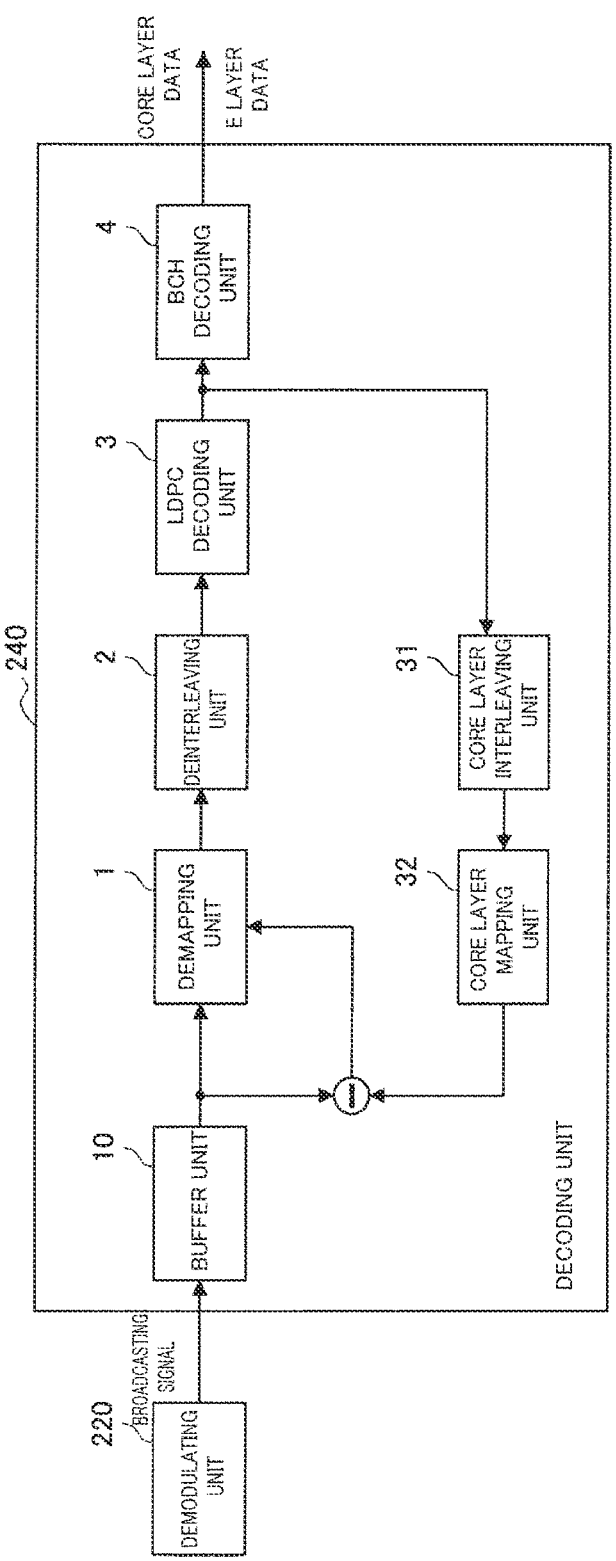
FIG. 7 is a diagram for explaining a modification of the decoding unit 240.

It should be noted that the core layer decoding unit 20 and the enhanced layer decoding unit 30 may be a common unit. FIG. 7 is a diagram for explaining a modification of the decoding unit 240. In FIG. 7, the demapping unit 1, the deinterleaving unit 2, the LDPC decoding unit 3, the BCH decoding unit 4, the core layer interleaving unit 31 and the core layer mapping unit 32 are included.

In FIG. 7, the demapping unit 1, the deinterleaving unit 2, the LDPC decoding unit 3 and the BCH decoding unit 4 are used for decoding the core layer signal and the enhanced layer signal.

As mentioned above, the core layer decoding unit 20 and the enhanced layer plural number 30 can share hardware in a part of the functional blocks.

3. EMBODIMENT 2

Embodiment 1 according to the present disclosure was described above. Next Embodiment 2 according to the present disclosure will be described. Essentially redundant content of the description in Embodiment 1 will be omitted, and differences from Embodiment 1 will be described.

3-1. Configuration Example of Decoding Unit 240 According to Embodiment 2

Figure 8:
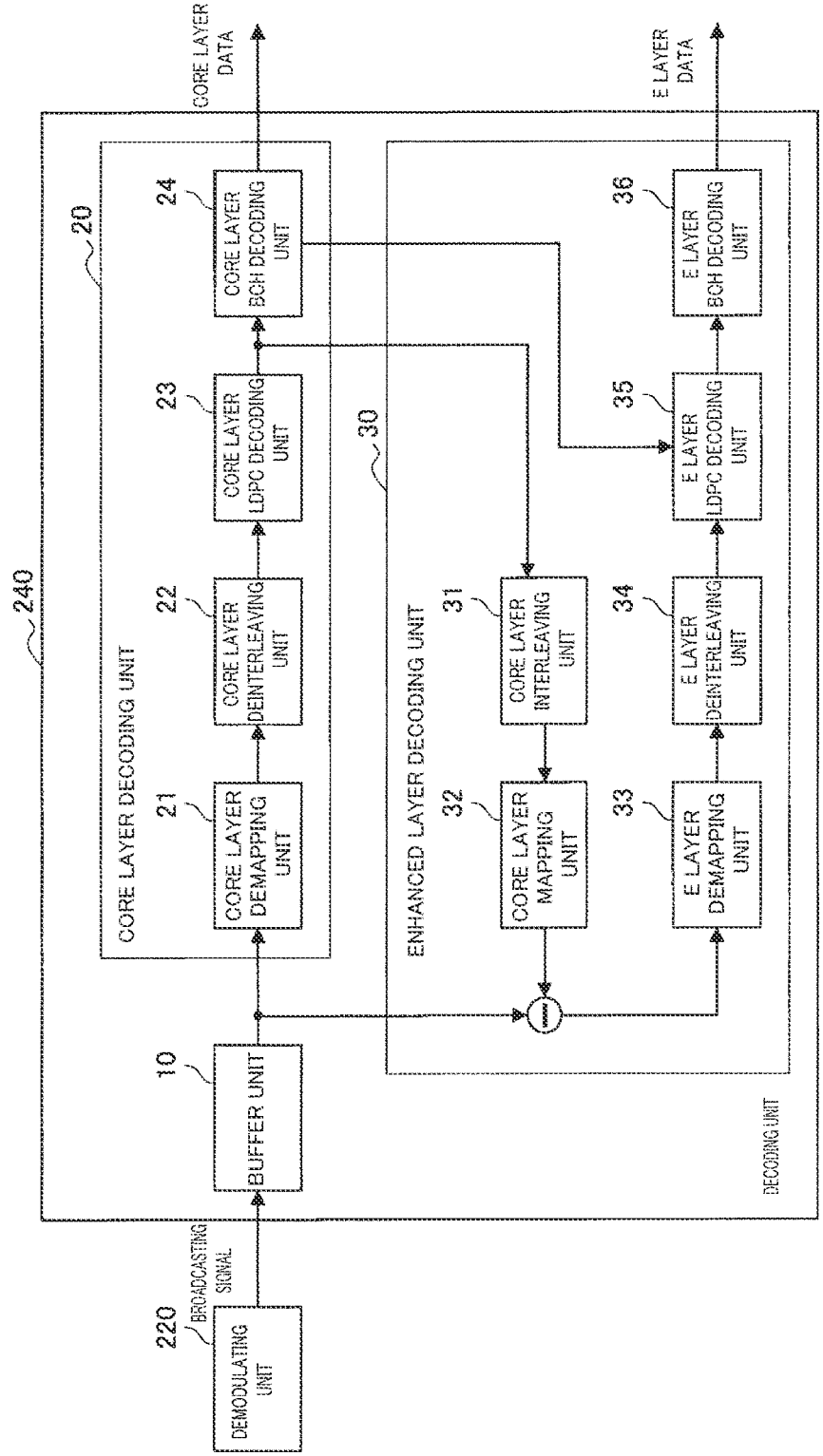
FIG. 8 is a block diagram depicting a functional configuration example of a decoding unit 240 according to Embodiment 2.

FIG. 8 is a block diagram depicting a functional configuration example of a decoding unit 240 according to the present embodiment. In FIG. 8, the core layer BCH decoding unit 24 transmits the result of the BCH decoding to the E layer LDPC decoding unit 35, and based on this result, the E layer LDPC decoding unit 35 determines whether the LDPC decoding of the enhanced layer signal is executed or not.

Specifically, the core layer BCH decoding unit 24 transmits the information to indicate whether the BCH decoding of the core layer signal succeeded or not to the E layer LDPC decoding unit 35. Based on this information, the E layer LDPC decoding unit 35 determines whether the LDPC decoding of the enhanced layer signal is executed or not, instead of determining whether the enhanced layer signal is decoded or not based on the noise information described in Embodiment 1.

In the case where information that the BCH decoding of the core layer signal succeeded is received from the core layer BCH decoding unit 24, the E layer LDPC decoding unit 35 executes the LDPC decoding of the enhanced layer signal. In the case where information that the BCH decoding of the core layer signal failed is received from the core layer BCH decoding unit 24, on the other hand, the E layer LDPC decoding unit 35 does not execute the LDPC decoding of the enhanced layer signal.

The core layer BCH decoding unit 24 may transmit the information that indicates whether the BCH decoding of the core layer signal succeeded or not to the core layer LDPC decoding unit 23. Then based on this information, the core layer LDPC decoding unit 23 may determine whether the result of the LDPC decoding is transmitted to the core layer interleaving unit 31 or not.

As described above, the signal processing system 1000 according to the present embodiment can determine that processing to decode the enhanced layer signal is performed in the case where the possibility of successfully decoding of the enhanced layer signal is high, and processing to decode the enhanced layer signal is not performed in the case where this possibility is low. According to this function, the multiplexed signal can be decoded more efficiently.

3-2. Example of Operation Flow of Decoding Unit 240 According to Embodiment 2

Figure 9:
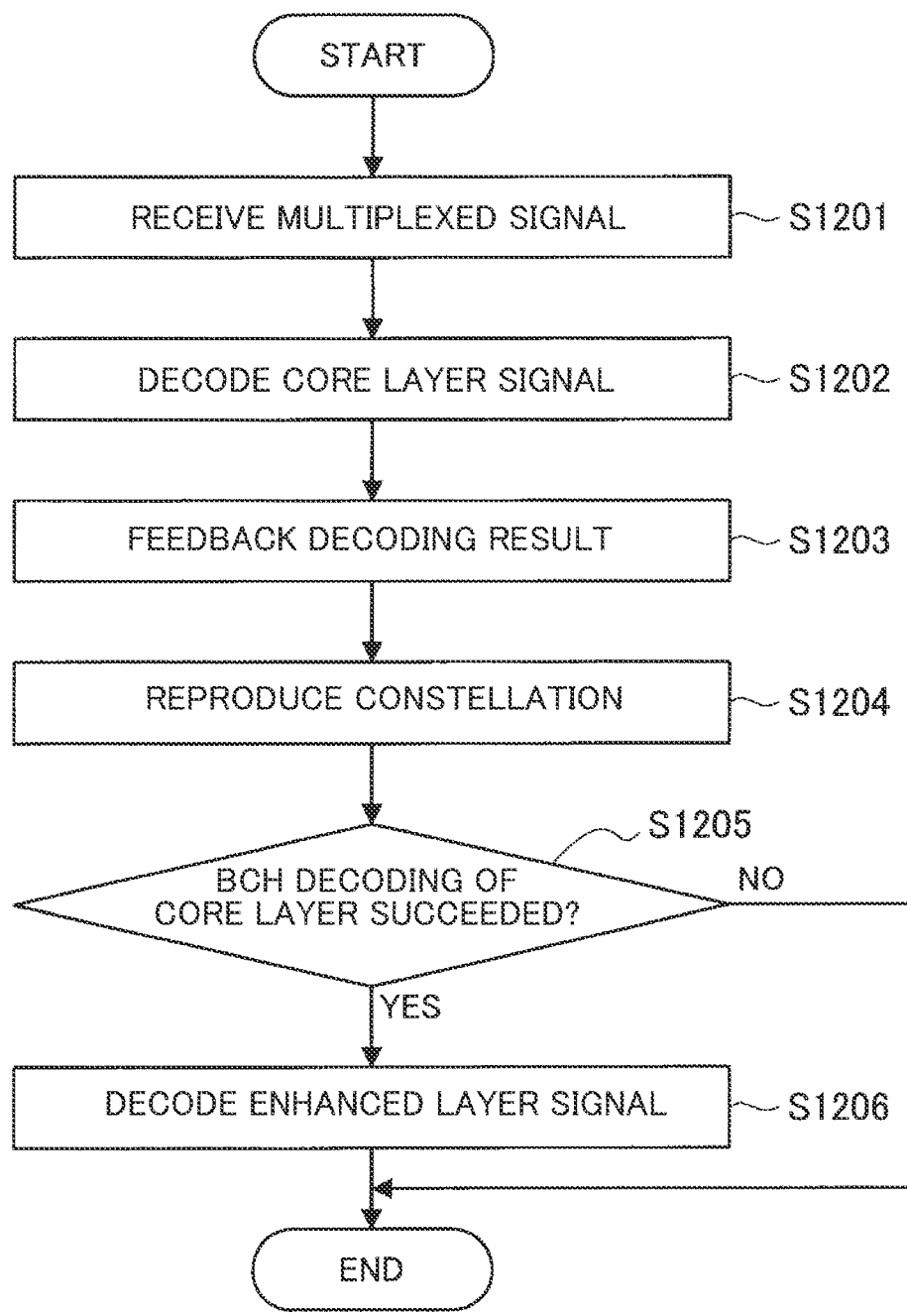
FIG. 9 is a flow chart depicting an example of an operation flow of the decoding unit 240 to decode a multiplexed signal according to Embodiment 2.

An operation flow of the decoding unit 240 to decode a multiplexed signal according to Embodiment 2 will be described next. FIG. 9 is a flow chart depicting an example of the operation flow of the decoding unit 240 to decode a multiplexed signal according to Embodiment 2.

With reference to FIG. 9, the buffer unit 10 receives a multiplexed signal transmitted from the demodulating unit 220 first (S1201). Then the core layer decoding unit 20 decodes the multiplexed signal transmitted from the buffer unit 10 using the core layer demapping unit 21, the core layer deinterleaving unit 22, the core layer LDPC decoding unit 23, and the core layer BCH decoding unit 24 (S1202). Then the core layer LDPC decoding unit 23 transmits the result of the LDPC decoding to the core layer interleaving unit 31 (S1203). Then the enhanced layer decoding unit 30 acquires the constellation of the enhanced layer signal based on the result of the LDPC decoding transmitted from the core layer LDPC decoding unit 23 using the core layer interleaving unit 31 and the core layer mapping unit 32 (S1204).

Then the core layer BCH decoding unit 24 determines whether the BCH decoding of the core layer signal succeeded (S1205). In the case where the core layer BCH decoding unit 24 determines that the BCH decoding of the core layer signal succeeded (S1205: YES), the core layer BCH decoding unit 24 transmits the information that indicates this success to the E layer LDPC decoding unit 35 (S1206). The enhanced layer decoding unit 30 receives this information and decodes the enhanced layer signal using the E layer demapping unit 33, the E layer deinterleaving unit 34, the E layer LDPC decoding unit 35, and the E layer BCH decoding unit 36 (S1206). In the case where the core layer BCH decoding unit 24 determines that the BCH decoding of the core layer signal failed (S1205: No), on the other hand, the core layer BCH decoding unit 24 transmits the information that indicates this success to the E layer LDPC decoding unit 35, and based on this information, the E layer LDPC decoding unit 35 does not decode the enhanced layer signal, and operation ends.

4. EMBODIMENT 3

Embodiment 2 according to the present disclosure was described above. Next Embodiment 3 according to the present disclosure will be described. Essentially the redundant content of the description in Embodiment 1 and Embodiment 2 will be omitted, and differences from Embodiment 1 and Embodiment 2 will be described.

The decoding unit 240 according to the present embodiment may determine whether the enhanced layer signal is decoded or not by combining the determination based on the SN estimation result according to Embodiment 1, and the determination based on the result of the BCH decoding of the core layer signal performed by the core layer BCH decoding unit 24 according to Embodiment 2, for example.

A specific example will now be described. The core layer LDPC decoding unit 23 according to Embodiment 3 transmits the result of the LDPC decoding to the later mentioned core layer interleaving unit 31 even if the SN estimation result is less than the required SN. The E layer LDPC decoding unit 35 receives the result of this LDPC decoding, and determines whether the LDPC decoding of the enhanced layer signal is executed or not based on the information that indicates whether the BCH decoding of the core layer signal transmitted by the core layer BCH decoding unit 24 succeeded or not.

As described above, according to the signal processing system of the present embodiment, the enhanced layer signal can be selectively decoded based on the noise information and the decoding result of the core layer signal. According to this function, the multiplexed signal can be decoded more efficiently compared with the case of decoding based on a single standard.

The operation related to combining the determination based on the SN estimation result and the determination based on the result of the BCH decoding of the core layer signal performed by the core layer BCH decoding unit 24 is not limited to the operation described above. Furthermore, the core layer LDPC decoding unit 23 and the E layer LDPC decoding unit 35 may execute the decoding processing without performing the above determination.

5. CONCLUSION

As described above, the first signal is decoded from the multiplexed signal in which the first signal and the second signals are multiplexed by the LDM system, and the second signal is selectively decoded from the multiplexed signal based on the noise information. According to this function, the multiplexed signal can be decoded more efficiently in the LDM system.

While the preferred embodiments of the present disclosure have been described in detail with reference to the accompanying drawings, the technical scope of the present disclosure is not limited to these examples. It should be understood that various modifications and alterations may be implemented by those skilled in the art within the scope of the technical concept of the appended Claims, and these modifications and alterations are included in the technical scope of the disclosure.

The effects stated in the present description are merely explanatory or exemplary and are not restrictive. In other words, the technique according to the present disclosure may exhibit other effects that are clear to those skilled in the art based on the description of the present description, along with the above-mentioned effects or instead of the above mentioned effects.

The following configuration is also within a technical scope of the present disclosure.

(1)

A decoding circuit including:

a first decoding unit that decodes a first signal from a multiplexed signal in which the first signal and a second signal are multiplexed in an LDM (Layered Division Multiplexing) system; and a second decoding unit that decodes the second signal from the multiplexed signal using the decoding result of the decoded first signal, wherein the second signal is selectively decoded based on noise information related to a reception state of the multiplexed signal.

(2)

The decoding circuit according to the above (1), wherein the second signal is not decoded in a case where it is determined that the reception state is not good based on the noise information.

(3)

The decoding circuit according to the above (1) or (2), wherein the second decoding unit decodes the second signal by subtracting the decoded first signal from the multiplexed signal.

(4)

The decoding circuit according to any one of the above (1) to (3), wherein the first signal is decoded by one or both of first decoding processing and second decoding processing, and the second signal is decoded by one or both of the first decoding processing and the second decoding processing.

(5)

The decoding circuit according to the above (4), wherein the first decoding unit sequentially performs the first decoding processing and the second decoding processing, and the second signal is decoded using the result of the decoding processing which is performed first in the first decoding processing and the second decoding processing.

(6)

The decoding circuit according to the above (4), wherein the first decoding unit sequentially performs the first decoding processing and the second decoding processing, and the second signal is decoded using the result of the first decoding processing and the second decoding processing.

(7)

The decoding circuit according to any one of the above (4) to (6), wherein the first decoding processing is one of LDPC (Low Density Parity Check) decoding and BCH decoding, and the second decoding processing is the other of the LDPC decoding and the BCH decoding.

(8)

The decoding circuit according to any one of the above (1) to (7), wherein the second signal is selectively decoded further based on the decoding result of the first signal.

(9)

The decoding circuit according to any one of the above (1) to (8), wherein the noise information is acquired by SN (Signal Noise) estimation or CN (Carrier Noise) estimation.

(10)

The decoding circuit according to any one of the above (1) to (9), wherein
the first signal and the second signal are signals conforming to the ATSC (Advanced Television Systems Committee) 3.0 standard.

(11)

The decoding circuit according to any one of the above (1) to (10), wherein
the first signal is a core layer signal, and
the second signal is an enhanced layer signal.

(12)

A decoding circuit including:
a first decoding unit that decodes a first signal from a multiplexed signal in which the first signal and a second signal are multiplexed in an LDM (Layered Division Multiplexing) system; and
a second decoding unit that decodes the second signal from the multiplexed signal using the decoding result of the decoded first signal, wherein the second signal is selectively decoded based on the decoding result of the first signal.

(13)

The decoding circuit according to the above (12), wherein
the second signal is not decoded in a case where it is determined that the decoding of the first signal failed.

REFERENCE SIGNS LIST

1000 Signal processing system
100 Receiving circuit
200 Demodulating circuit
220 Demodulating unit
240 Decoding unit
10 Buffer unit
20 Core layer decoding unit
21 Core layer demapping unit
22 Core layer deinterleaving unit
23 Core layer LDPC decoding unit
24 Core layer BCH decoding unit
30 Enhanced layer decoding unit
31 Core layer interleaving unit
32 Core layer mapping unit
33 E layer demapping unit
34 E layer deinterleaving unit
35 E layer LDPC decoding unit
36 E layer BCH decoding unit
300 Processing circuit

The invention claimed is:

1. A decoding circuit, comprising:
circuitry configured to:
determine noise information related to a reception state of a multiplexed signal, received via a communication channel, in which a first signal and a second signal are multiplexed in a layered division multiplexing (LDM) system;
decode the first signal from the multiplexed signal; and
selectively decode the second signal from the multiplexed signal based on a decoding result of the decoded first signal and the determined noise information related to the reception state of the multiplexed signal.

2. The decoding circuit according to claim 1, wherein
the noise information includes an amount of noise in the multiplexed signal,
the second signal is not decoded based on a determination that the reception state is not a good reception state, and
the reception state is determined not to be the good reception state based on the amount of noise is more than a threshold value.

3. The decoding circuit according to claim 1, wherein the circuitry is further configured to decode the second signal based on subtraction of the decoded first signal from the multiplexed signal.

4. The decoding circuit according to claim 1, wherein
the first signal is decoded based on at least one of a first decoding process or a second decoding process, and
the second signal is decoded based on at least one of the first decoding process or the second decoding process.

5. The decoding circuit according to claim 4, wherein
the circuitry is further configured to sequentially perform the first decoding process and the second decoding process, and
the second signal is decoded based on a result of a decoding processing which is performed first in the first decoding process and the second decoding process.

6. The decoding circuit according to claim 4, wherein
the circuitry is further configured to sequentially perform the first decoding process and the second decoding process, and
the second signal is decoded based on a result of the first decoding process and the second decoding process.

7. The decoding circuit according to claim 4, wherein
the first decoding process is one of Low Density Parity Check (LDPC) decoding or BCH decoding, and
the second decoding process is the other of the LDPC decoding or the BCH decoding.

8. The decoding circuit according to claim 1, wherein the noise information is acquired based on one of Signal Noise (SN) estimation or Carrier Noise (CN) estimation.

9. The decoding circuit according to claim 1, wherein the first signal and the second signal are signals conforming to Advanced Television Systems Committee (ATSC) 3.0 standard.

10. The decoding circuit according to claim 1, wherein
the first signal is a core layer signal, and
the second signal is an enhanced layer signal.

11. A decoding circuit, comprising:
circuitry configured to:
determine noise information related to a reception state of a multiplexed signal, received via a communication channel, in which a first signal and a second signal are multiplexed in a layered division multiplexing (LDM) system;
decode the first signal from the multiplexed signal; and
selectively decode the second signal from the multiplexed signal based on a decoding result of the decoded first signal.

12. The decoding circuit according to claim 11, wherein the second signal is not decoded based on a determination that the decoding of the first signal failed.

* * * * *